United States Patent
Fonk et al.

(10) Patent No.: US 8,921,164 B2
(45) Date of Patent: Dec. 30, 2014

(54) SEMICONDUCTOR INTEGRATED DEVICE ASSEMBLY PROCESS

(71) Applicants: STMicroelectronics Ltd (Malta), Kirkop (MT); STMicroelectronics S.r.l., Agrate Brianza (IT)

(72) Inventors: Kenneth Fonk, San Gwann (MT); Luca Maggi, Garlate (IT); Jeremy Spiteri, Msida (MT)

(73) Assignees: STMicroelectronics Ltd (Malta), Kirkop (MT); STMicroelectronics S.r.l., Agrate Brianza (IT)

( * ) Notice: Subject to any disclaimer, the term of this patent is extended or adjusted under 35 U.S.C. 154(b) by 18 days.

(21) Appl. No.: 13/772,210

(22) Filed: Feb. 20, 2013

(65) Prior Publication Data
US 2013/0214368 A1 Aug. 22, 2013

(30) Foreign Application Priority Data
Feb. 21, 2012 (IT) ............................. TO2012A0154

(51) Int. Cl.
H01L 21/00 (2006.01)
H01L 23/495 (2006.01)

(52) U.S. Cl.
USPC .......................... 438/123; 257/667

(58) Field of Classification Search
USPC ............................... 257/666–671, 778–780, 257/E23.031–E23.059; 438/111, 123
See application file for complete search history.

(56) References Cited

U.S. PATENT DOCUMENTS

| | | | | |
|---|---|---|---|---|
| 5,864,178 A * | 1/1999 | Yamada et al. | ................ | 257/737 |
| 6,828,661 B2 * | 12/2004 | Araki et al. | .................... | 257/676 |
| 7,102,218 B2 * | 9/2006 | Huang et al. | ................... | 257/686 |
| 7,560,811 B2 * | 7/2009 | Sakakibara et al. | .......... | 257/704 |
| 7,562,573 B2 | 7/2009 | Yazdi | | |
| 2004/0232507 A1 | 11/2004 | Furukubo et al. | | |
| 2007/0029629 A1 | 2/2007 | Yazdi | | |
| 2008/0131662 A1 | 6/2008 | Jordan et al. | | |

* cited by examiner

*Primary Examiner* — Calvin Lee
(74) *Attorney, Agent, or Firm* — Seed IP Law Group PLLC

(57) ABSTRACT

A process for assembly of an integrated device, envisages: providing a first body of semiconductor material integrating at least one electronic circuit and having a top surface; providing a second body of semiconductor material integrating at least one microelectromechanical structure and having a bottom surface; and stacking the second body on the first body with the interposition, between the top surface of the first body and the bottom surface of the second body, of an elastic spacer material. Prior to the stacking step, the step is envisaged of providing, in an integrated manner, at the top surface of the first body a confinement and spacing structure that confines inside it the elastic spacer material and supports the second body at a distance from the first body during the stacking step.

27 Claims, 6 Drawing Sheets

SEMICONDUCTOR INTEGRATED DEVICE ASSEMBLY PROCESS

BACKGROUND

1. Technical Field

The present disclosure relates to a semiconductor integrated device assembly process. In particular, the following treatment generally refers, without this implying any loss of generality, to an integrated sensor device and a process of assembling same.

2. Description of the Related Art

As it is known, an integrated sensor device includes one or more dice of semiconductor material (for example silicon), provided in which are electronic circuits (for example, an ASIC—Application Specific Integrated Circuit) and microelectromechanical (MEMS) detection structures, and which are enclosed in a package that has protection and coating functions and provides suitable electrical connections towards the outside world, for example for being welded to a printed circuit board. Common packages are the so-called SO or else SOIC (Small Outline Integrated Circuit) packages, or else the BGA (Ball Grid Array) or LGA (Land Grid Array) packages, which offer a small area occupation and high density of the electrical contacts towards the outside world.

In particular, for assembly of an integrated sensor device, the use is known of a solution "stacked" in the vertical direction, whereby a die integrating a MEMS detection structure is coupled on top of, or underneath, a die integrating a corresponding ASIC electronic circuit (designed, for example, to process the electrical quantities and signals transduced by the detection structure). The two dice are, for example, coupled together by interposition of a layer of adhesive material, with assembly techniques generally known as "attachment" techniques.

This stacked solution affords a reduction of the occupation of area of the integrated sensor device in a horizontal direction (parallel, for example, to the surface of the printed circuit board to which the device is coupled), and is hence particularly advantageous in the case of portable applications.

BRIEF SUMMARY

It has, however, been found that, in a solution of this type, in the case where the MEMS detection structure is set on top of the die of the ASIC electronic circuit, the MEMS detection structure may be subject to mechanical stresses due to mechanical coupling with the die of the ASIC electronic circuit, and that these stresses may entail a drift of the electrical parameters of the detection structure. In fact, in a known way, the mechanical properties of the detection structures affect directly the electrical quantities and/or the electrical signals supplied at their output, in so far as the same electrical quantities and/or signals are a function of deformations (for example, of piezoresistive elements, or a membranes) or movements of mobile parts (for example, inertial masses) of the detection structures.

These stresses may be transmitted to the die of the MEMS detection structure from the die of the ASIC electronic circuit, which may, for example, be subject to deformations of the package of the integrated sensor device (for example, on account of bending due to differences in the thermal coefficients of the constituent materials). In general, there can be a wide range of causes for mechanical stresses that may jeopardize proper operation (as per design specifications) of the MEMS detection structure.

In order to limit this problem, the present Applicant has consequently proposed setting between the die of the MEMS detection structure and the die of the ASIC electronic circuit, which are vertically stacked, an elastic cushion layer to absorb the mechanical stresses that would otherwise be directed towards the MEMS detection structure. In particular, this elastic layer is made of an adhesive material, such as a resin (or glue), for example a silicone one, with high flexibility and low Young's modulus.

The assembly process in this case envisages a localized distribution, in one or more points, of drops of the adhesive material on a top surface of the die of the ASIC electronic circuit, on which a bottom surface of the die of the MEMS detection structure is then rested. By pressure exerted thereon, the adhesive material distributes underneath the aforesaid die of the MEMS detection structure in such a way as to constitute, once solidified (through an operation of high-temperature hardening, referred to as "curing"), the aforesaid elastic cushion layer. This assembly process may possibly envisage provision and hardening of the adhesive material in two or more successive steps in order, for example, to obtain sufficient thicknesses of the elastic layer.

The present Applicant has, however, found that this assembly solution is affected by some problems that do not enable full exploitation of the advantage afforded in terms of elastic separation of the MEMS detection structure from the mechanical stresses.

In particular, the aforesaid process of assembly does not enable a uniform thickness to be obtained of the aforesaid elastic cushion layer underneath the die of the MEMS detection structure in the vertical stacking direction (thickness, which is defined in general as BLT—Bond-Line Thickness), leading to an inclination and a lack of planarity, which may even be considerable, of the die itself. For example, the present Applicant has found possible variations of this thickness along the horizontal extension of the die of even up to 20% (for example variations of up to 10 µm in the case of a nominal thickness of 50 µm).

This lack of planarity may jeopardize connection operations through electrical wires (so-called "wire bonding" operations) of contact pads present on the top surface of the die of the ASIC electronic circuit to corresponding contact pads present on a respective top surface of the die of the MEMS detection structure.

In order to ensure an adequate uniformity of the aforesaid thickness and an adequate repeatability of its value, it is required to resort to complex operations of optical inspection and to performing microsections through the assembled devices, with consequent increase in the manufacturing process times and decrease in the yield of the process itself, given that the sectioned devices can evidently not be re-used.

The present disclosure may solve, at least in part, one or more of the problems highlighted previously, in particular as regards assembly of the dice in the case where an adequate elastic separation between the dice themselves is required.

According to the present disclosure, a process of assembly and a corresponding assembly of a semiconductor integrated device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be described in detail, one aspect of the present disclosure envisages, at the end of the process of manufacturing a first body of semiconductor material, such as a semiconductor body integrating an ASIC electronic circuit, formation, with so-called "front end" process steps, of a confinement and spacing integrated structure on a top surface of the same first body, designed for coupling with a second body of semiconductor material, such as a semiconductor body integrating a MEMS detection structure. In particular, the confinement and spacing structure is obtained with lithographic techniques and is designed for confinement, and for a precise definition of a thickness, of an adhesive elastic material to be set between the dice to obtain mechanical coupling thereof with elastic separation (with regards to the mechanical stresses between the dice).

Figure 1A:
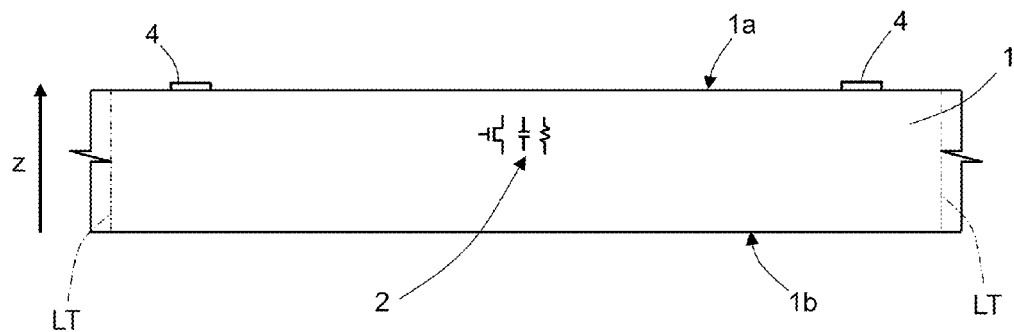
FIGS. 1a-1e show successive cross sections of a wafer of semiconductor material in successive steps of the process of assembly according to one embodiment of the disclosure.

In detail, FIG. 1a shows a wafer, designated by 1, including a body of semiconductor material, for example silicon, and overlying layers of metal (so-called "metal layers or levels") and/or dielectric materials (so-called "passivation levels or layers"). In the wafer 1 there have been previously provided, with known manufacturing techniques, a plurality of electronic circuits (ASIC), one of which is shown, designated by 2 and represented schematically by means of some electronic components provided by way of example. Each ASIC electronic circuit 2 (it should be noted that by this expression is meant the set of the components and electronic circuits that concur in obtaining a desired function) is designed to be integrated within a respective die, following upon a so-called "sawing" operation of the wafer 1, at respective sawing lines, designated by LT.

The wafer 1 has a top surface 1a, corresponding, in a way not illustrated, to the outer surface of a final passivation layer, at which a plurality of groups of contact pads, designated by 4, are defined, which are hence accessible from outside the wafer 1 for electrical contact of a respective ASIC electronic circuit 2 (each group being provided, in an evident way, for a respective die). The contact pads 4 may, unlike what is schematically illustrated in FIG. 1a and in the subsequent Figures, also be set flush with the top surface 1a (being in this case "embedded" in the final passivation layer, so as to be in any case accessible from outside).

The wafer 1 moreover has a bottom surface 1b, opposite to the top surface 1a in a vertical direction (parallel to a vertical axis z, represented in FIG. 1a).

An aspect of the present disclosure envisages, at the end of the process of manufacturing of the various electronic circuits 2, formation via lithographic techniques, on the top surface 1a of the wafer 1, of a patterned layer made of resist, having, in a region corresponding to each die, a desired pattern.

Figure 1B:
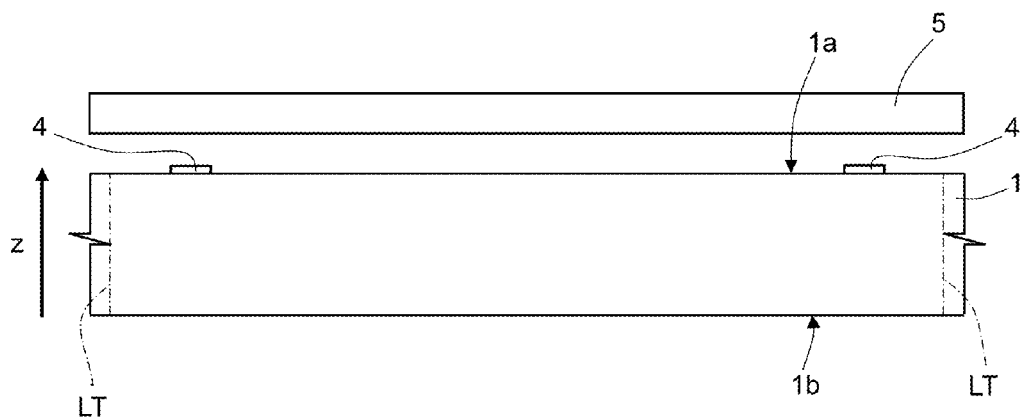
Figure 1C:
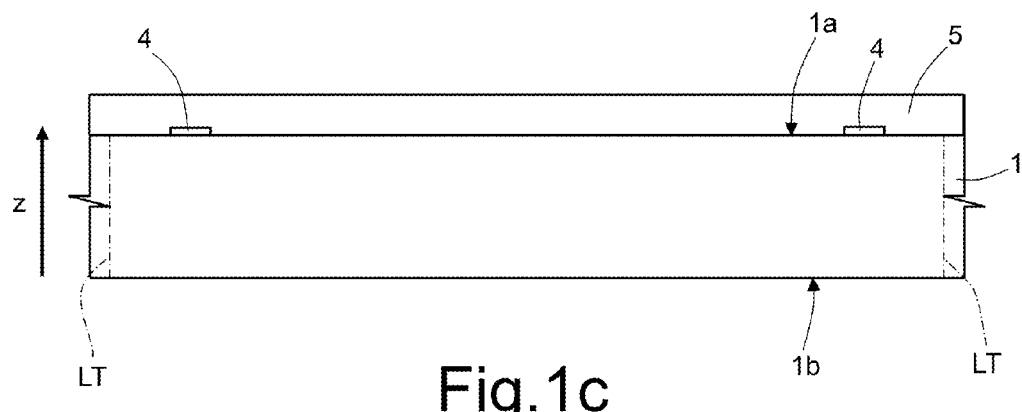

In the embodiment described herein, as shown in FIGS. 1b-1c, this resist layer, designated by 5, is constituted by a dry film, which is deposited by lamination on the top surface 1a of the wafer 1. For example, the dry film is of a photosensitive polymeric material.

Figure 1D:
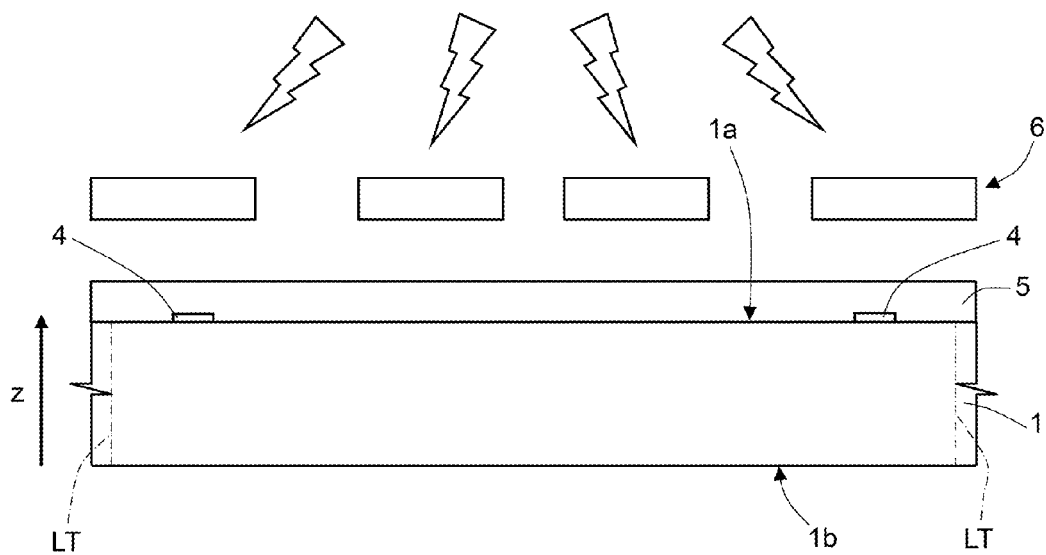

As shown in FIG. 1d, the resist layer 5 is then subjected to exposure to a light source with appropriate characteristics, through an exposure mask 6 having a desired pattern.

Figure 1E:
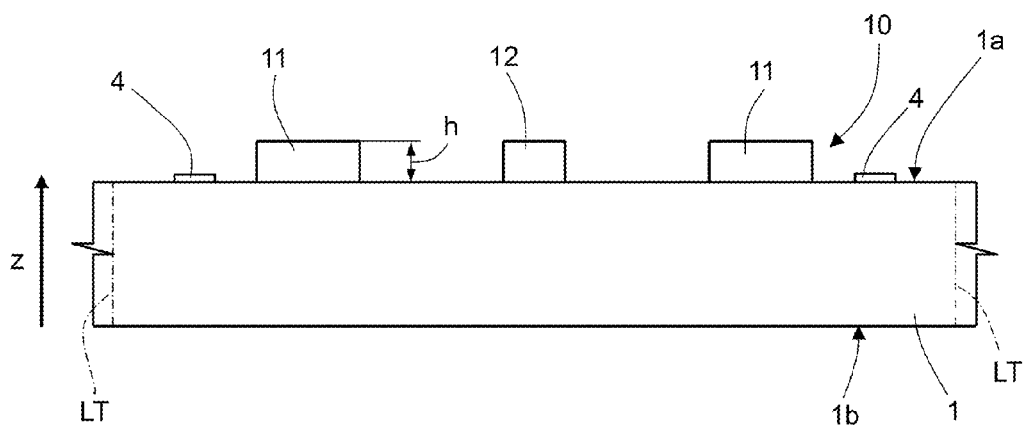

There follows (FIG. 1e) a development step, which leads to selective removal of regions of the resist layer 5 (FIGS. 1d-1e refer to a resist with positive polarity; in an evident way, not illustrated, a resist with negative polarity may alternatively be used, with an obvious modification of the exposure mask 6).

According to a particular aspect of the present disclosure, remaining portions of the resist layer 5 define an appropriate confinement and spacing structure, designated by 10, at each die integrated in the wafer 1. In particular, the thickness, designated by h, of the resist layer 5, and hence of the aforesaid remaining portions, in the vertical direction (along the axis z in FIG. 1e), is comprised, for example, between 40 μm and 50 μm.

For the reasons that will emerge more clearly hereinafter, various embodiments can be envisaged for the confinement and spacing structure 10.

Figure 2A:
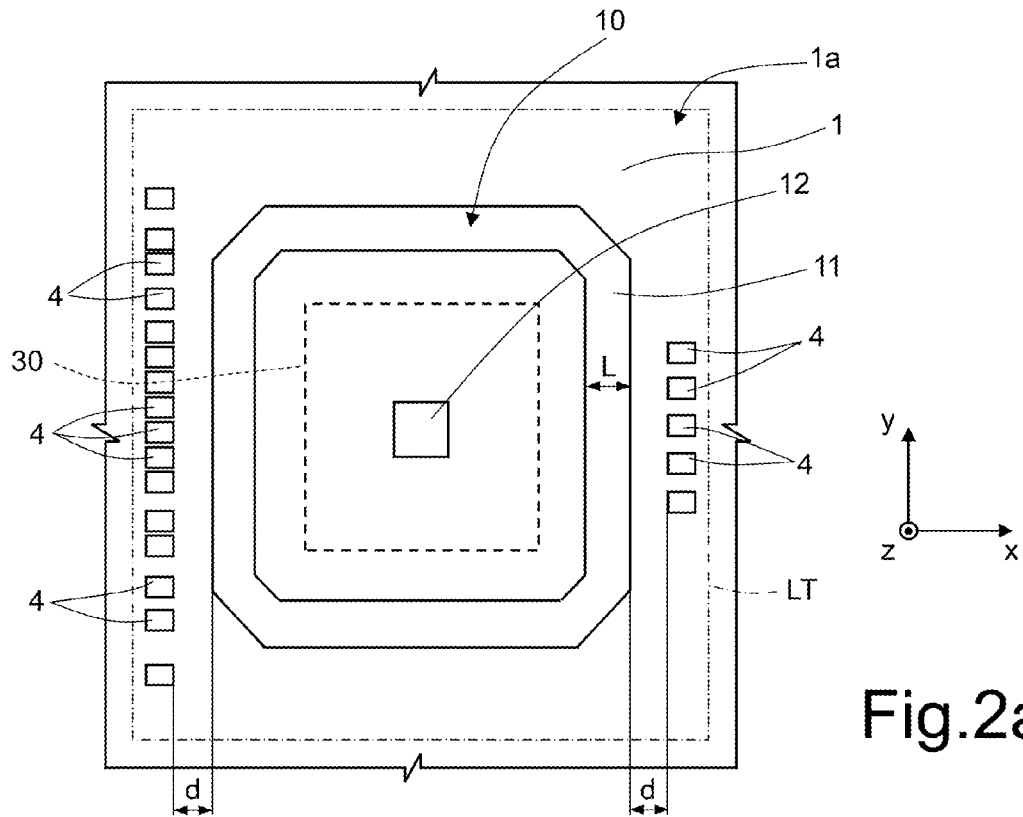
FIGS. 2a-2d show plan views of a top surface of the wafer in respective variant embodiments.

In a first embodiment, shown in FIG. 2a (to which also the cross section of FIG. 1e refers, by way of example), the confinement and spacing structure 10 comprises a confinement element (or barrier, or dam) 11, shaped as a whole substantially like a square ring, with sides extending along a first horizontal axis x and a second horizontal axis y of a horizontal plane xy parallel to the top surface 1a of the wafer 1.

The sides that define the closed periphery of the confinement element 11 are substantially parallel to the sawing lines LT that define the boundaries or edges of what will be the respective die, once the sawing operations have been performed. The width of each side of the confinement element 10, designated by L, is comprised, for example, between 100 μm and 150 μm, and is preferably equal to 120 μm. In addition, the distance, designated by d in FIG. 2a, measured along the horizontal axes x and y, between the confinement element 11 and the contact pads 4 set on the top surface 1a of the wafer 1 is not less than 100 μm, and is preferably between 100 μm and 150 μm, in such a way as not to create obstacles during subsequent operations of connection of electrical wires to the contact pads 4 (wire-bonding operation). It should be noted that, in the embodiment illustrated, the contact pads 4 are aligned along the edges of the die, parallel to the sawing lines LT, in the proximity of the same sawing lines LT.

The confinement and spacing structure 10 further comprises a spacer element 12, which is set internally with respect to the closed periphery of the confinement element 11 (in the aforesaid horizontal plane xy), in an approximately central position with respect to the same confinement element 11, has a columnar conformation and in plan view has a substantially square shape, with a side having an extension for example of between 100 μm and 150 μm, preferably, 100 μm.

Figure 2B:
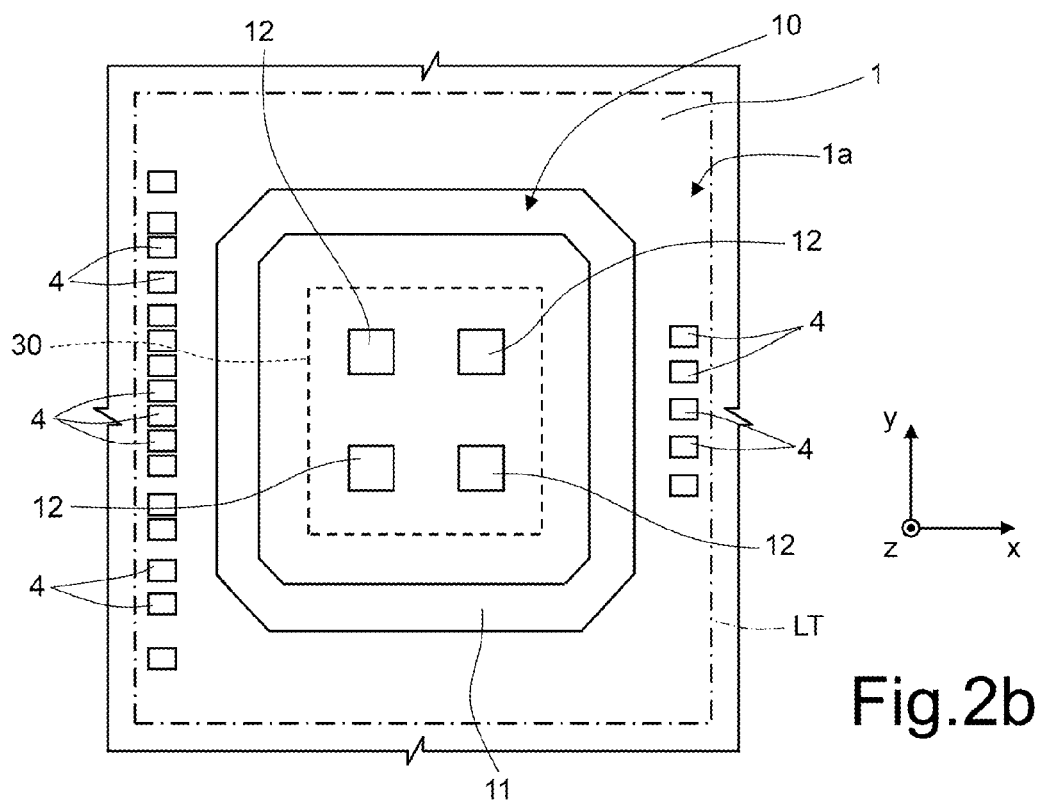

In a second embodiment (illustrated in FIG. 2b) a plurality of spacer elements, such as four spacer elements 12 are, instead, present, each with a conformation substantially similar to the one described with reference to FIG. 2a, arranged at the vertices of a square contained within the confinement element 11 and having sides parallel to the horizontal axes x and y.

Figure 2C:
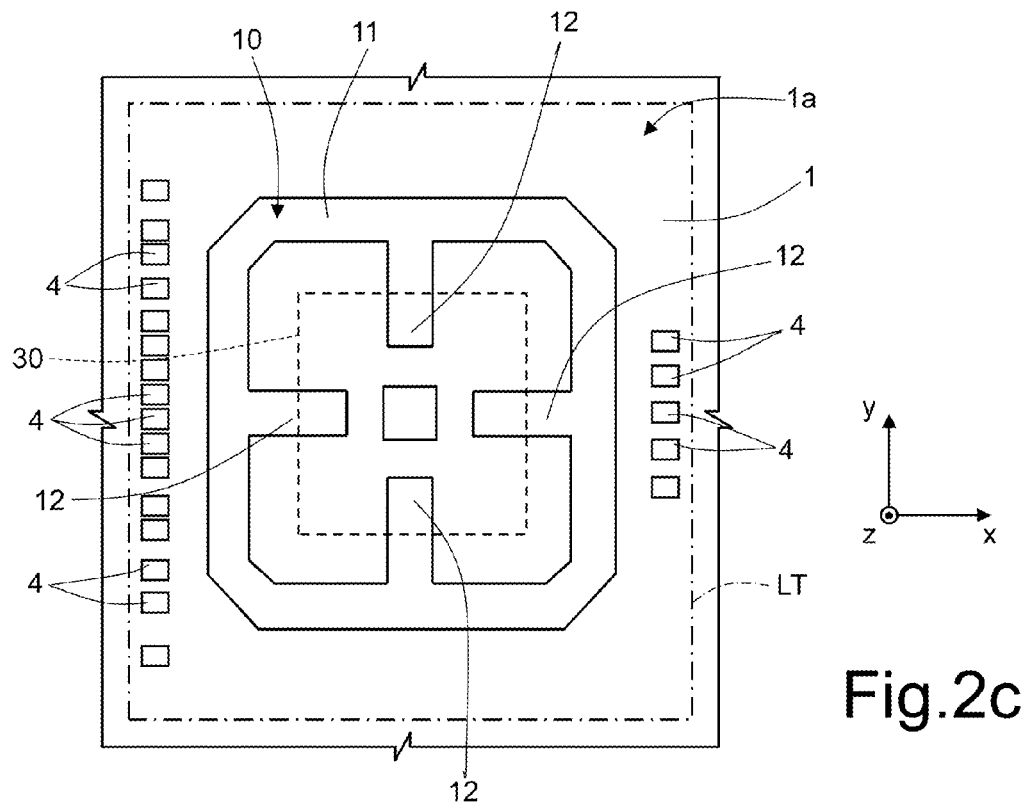

In a third embodiment, shown in FIG. 2c, the spacer elements 12, once again four in number, have a rectangular shape in plan view, with extension along the horizontal axes x and y, and are arranged at the ends of the arms of a cross, on the inside of the confinement element 11, starting from a substantially central point of a respective side of the confinement element 11 itself.

In a fourth embodiment (shown in FIG. 2d), the confinement and spacing structure 10 does not comprise, instead, any spacer element 12, and the confinement element 11, once again having substantially the shape of a square ring, has sides inclined with respect to the horizontal axes x, y and to the sawing lines LT (and to the edges of the die), with an angle of inclination for example of 45°.

The manufacturing process proceeds then with the so-called "back end" steps, i.e., steps of assembly and, in a way that is not directly related to the present disclosure, of packaging in a suitable package. These steps are performed starting from the wafer 1, now including the confinement and spacing structure 10.

Figure 3A:
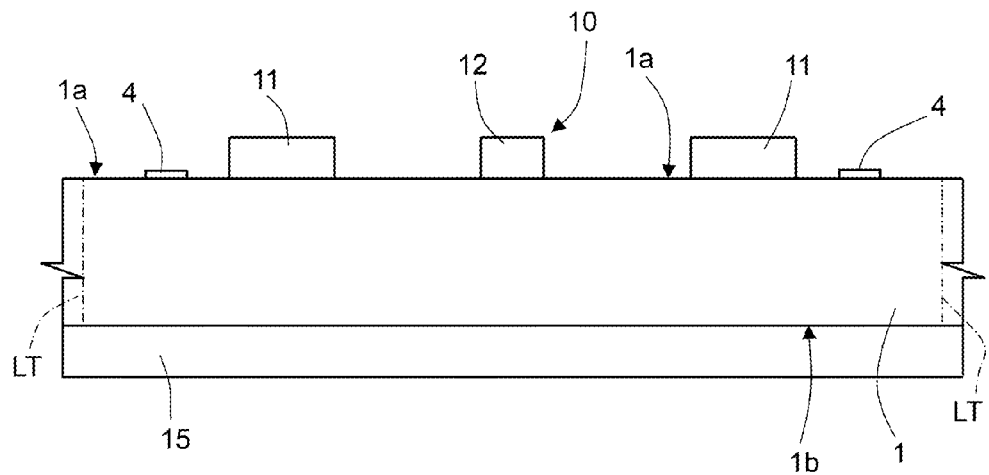
FIGS. 3a-3d show cross sections in successive steps of the assembly process.

In particular, as shown in FIG. 3a, an adhesive film 15 (DAF—Die Attach Film) is formed underneath the bottom surface of the wafer 1, for example, with a lamination process.

Next, the wafer 1 is subjected to sawing, or singulation, process along the sawing lines LT previously defined, to form a plurality of dice, each integrating a respective ASIC electronic circuit 2 and a respective confinement and spacing structure 10. In what follows, reference will be made only to one of such dice, which will be referred to as "first die" and designated by 20.

Figure 3B:
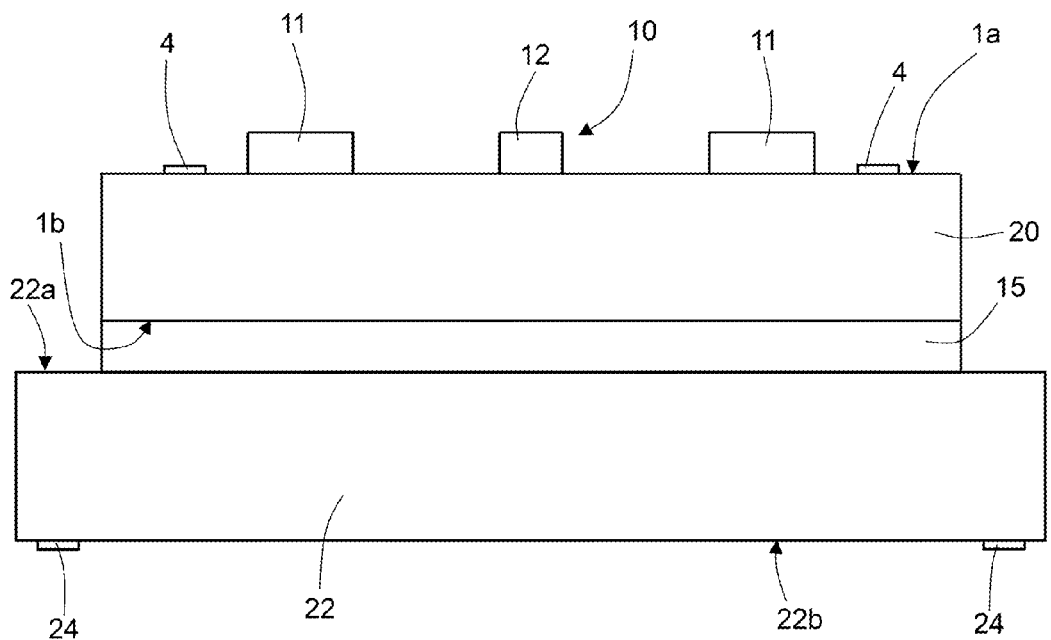
Figure 3C:
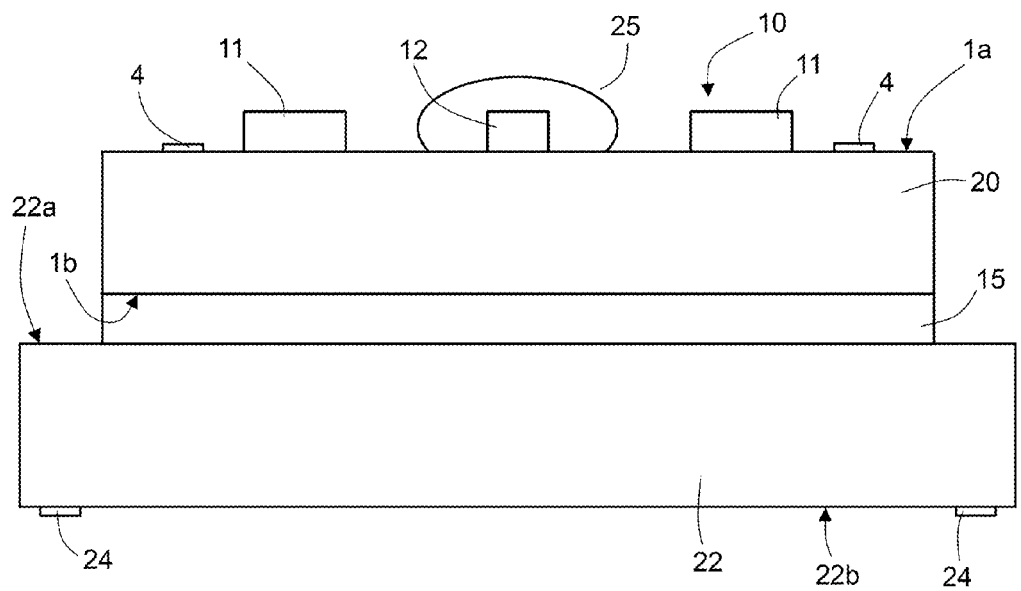

As shown in FIG. 3b, the first die 20 is then attached to a substrate 22, designed to constitute a bottom base of the package of the final integrated device. In particular, the first die 20 is set on an inner face 22a of the substrate 22, with the adhesive film 15 set between the bottom surface 1b of the first die 20 itself and the inner face 22a of the substrate 22. Arranged on an outer face 22b of the substrate 22 are electrical-contact elements, designated by 24, for example in the form of conductive balls (in the case of a BGA package) or conductive pads (in the case of an LGA package), for electrical connection towards the outside world, for example to a printed circuit board (herein not illustrated).

According to an aspect of the present disclosure, at this stage, an amount of adhesive material is distributed within the confinement element 11 of the confinement and spacing structure 10, in a localized manner, in particular at a central position with respect to the confinement element 11 (considered in the horizontal plane xy).

In the embodiment illustrated, which refers, by way of example, to the pattern of FIG. 2a, a single region of adhesive material is distributed, designated by 25, shaped like a drop, in such a way as to cover at least partially the spacer element 12, set in the central position. It is, however, possible to distribute the adhesive material in a number of distinct regions, or drops, within the confinement element 11. In particular, the thickness of the region of adhesive material 25 is greater than that of the confinement and spacing structure 10, in the example greater than 50 µm. The adhesive material is constituted by a material, such as an epoxy or silicone resin (or glue), with high flexibility and low Young's modulus, preferably comprised between 0.5 MPa and 10 MPa, for example, 1 MPa.

Figure 3D:
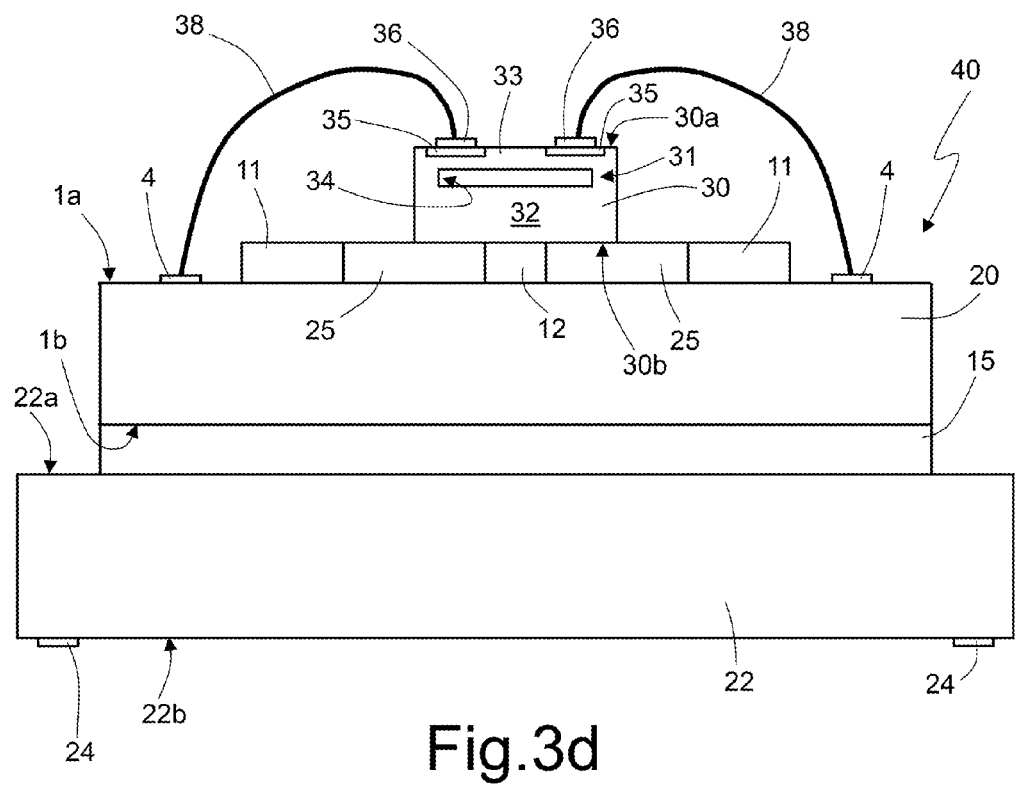

Next, as shown in FIG. 3d, there is first provided a second die, designated by 30, which has been previously subjected to a plurality of front-end process steps, in a way in itself known and not described in detail herein, for integrated manufacturing of a MEMS detection structure 31, for example, in the embodiment illustrated, a pressure-detection structure. In this embodiment, the second die 30 includes a body 32 of semiconductor material, for example silicon, and has a top face 30a and a bottom face 30b. A membrane 33 is suspended above a cavity 34, contained and isolated within the body 32, and is set in a position corresponding to the top face 30a. Piezoresistive elements 35, for example connected in a suitable way so as to form a Wheatstone bridge, are provided within the membrane 33 so as to sense, in use, deformations thereof due to incident pressure waves. Electrical-contact pads 36 are set in a position corresponding to the top face 30a and are electrically connected to the piezoresistive elements 35.

The assembly process then proceeds with coupling of the second die 30 to the first die 20, and consequent electrical coupling of the corresponding ASIC electronic circuit 2 and of the corresponding MEMS detection structure 31. For this purpose, the second die 30 is set above the confinement and spacing structure 10 of the first die 20, on the inside of the confinement element 11, in particular with a contact portion of the bottom face 30b that contacts at the top the spacer element 12, resting thereon. Consequently, upon pressure exerted in the vertical direction, the region of adhesive material 25 is squeezed and widens horizontally distributing inside the confinement and spacing structure 10, remaining confined within the structure itself owing to the presence of the confinement element 11. The region of adhesive material 25 is at this point subjected to a treatment of curing at a high temperature, for example at a temperature of 170° C. for a time interval of 90 minutes in such a way as to define a supporting region, or platform, for the second die 30.

In particular, once assembly between the first and second dice 20, 30 is through, the confinement and spacing structure 10 hence determines the thickness of adhesive material set between the dice themselves, a thickness that hence provides a precise and repeatable value (being determined by the thickness of the resist layer 5 from which the confinement and spacing structure 10 has been obtained). In a way substantially similar to what has been previously discussed, the region of adhesive material 25 constitutes a soft elastic cushion layer, such as to absorb the mechanical stresses that could otherwise reach the MEMS detection structure 31 and jeopardize proper operation thereof.

The confinement and spacing structure 10 moreover constitutes a support for the second die 30, when it is set on top of the first die 20 before the region of adhesive material 25 is subjected to curing. The shape and arrangement of the spacer element 11 (or spacer elements 11, see the various patterns illustrated previously) is hence designed for providing an adequate support for the second die 30 and in particular in such a way that the second die 30 is placed, and remains, substantially parallel to the horizontal plane xy (the bottom face 30b of the second die 30 remaining substantially parallel to the top surface 1a of the first die 20).

In a way that will be apparent, also based on the dimensions of the second die 30, it may prove each time more advantageous to adopt one pattern of the confinement and spacing structure 10 rather than another. In general, the increase in the number and dimensions of the spacer elements 12 may prove advantageous to ensure a greater stability and planarity of the second die 30 when it is rested on the first die 20, with the disadvantage, however, of reducing the elastic separation between the first die 20 and the second die 30, ensured by the region of adhesive material 25.

In fact, the surface increase of the contact portion of the bottom face 30b of the second die 30 with the confinement and spacing structure 10 (having a Young's modulus higher than that of the region of adhesive material 25 and a lower elasticity) may entail a higher mechanical stress of the second die 30 by the first die 20 (or by elements mechanically coupled thereto, for example the package of the integrated device).

The pattern and conformation of the structure used will hence derive from a compromise between the requirements of stability and planarity of the mechanical coupling between the dice 20, 30 and of elastic separation that it is intended to guarantee between the same dice 20, 30.

Figure 2D:
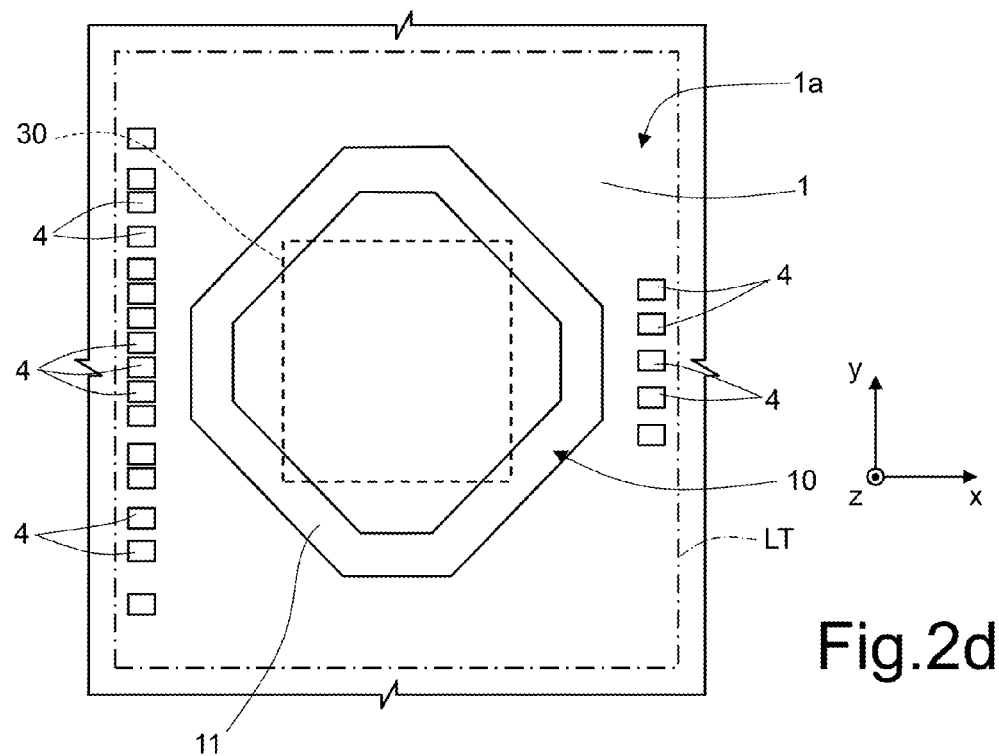

For example, from FIGS. 2a-2d described previously, where the overall dimensions of the second die 30 inside the confinement element 11 is represented by a dashed line (it should hence be noted that the second die 30 has in any case an extension in plan view, in the horizontal plane xy, that is less than a corresponding extension of the first die 20 and of the confinement and spacing structure 10), it is evident that the pattern of FIG. 2d enables a maximum elastic decoupling to be obtained, with the risk, however, of the second die 30 not being sufficiently supported (the second die 30 is in this case supported by the walls of the same confinement element 11). Likewise, it is evident that the pattern of FIG. 2c offers a certainly higher stability of the mechanical coupling between the dice 20, 30, given the greater extension of the resting surface, here guaranteed by the four spacer elements 12 with rectangular extension, at the expense, however, of a smaller elastic separation between the same dice 20, 30.

In an equally evident way, various number and shapes of the confinement and spacing structure 10 may also be envisaged. Generally described, the confinement and spacing structure includes a confinement element that is a substantially closed structure, and in many embodiments the confinement element surrounds one or more spacing elements. In one embodiment, three spacer elements 12 may be provided, arranged at the vertices of an equilateral triangle centrally with respect to the confinement element 11. Alternatively, an array of spacer elements 12 may be provided, arranged in a regular way, in rows and columns, within the confinement element 11, each being, for example, provided as described with reference to FIG. 2a, or in general having the minimum overall dimensions possible in the horizontal plane xy allowed by the lithographic process used for its definition.

As is shown in FIG. 3d, the assembly process proceeds with the operations of electrical connection of the contact pads 4 carried by the first die 20 to the contact pads 36 carried by the second die 30, by the wire-bonding technique and electrical wires 38, and then ends with known packaging steps (which for this reason are not illustrated and described in detail), for example with the coating of the assembly of the first and second dice 20, 30 previously obtained with a protection and packaging region (known as "mold compound").

The method described enables manufacturing of an integrated sensor device, designated as a whole by 40, in which the MEMS detection structure 31 is designed to transduce a quantity to be detected (for example, a pressure) into an electrical quantity or signal (for example, a variation of resistance or of an electrical signal at output from the Wheatstone bridge), and the ASIC electronic circuit 2 is designed to process the electrical quantity or signal in order to determine the value assumed by the quantity to be detected.

The advantages of the assembly process and of the corresponding assembly emerge clearly from the foregoing description.

In any case, it is once again emphasized that the confinement and spacing structure 10 offers a dual advantage in so far as it makes it possible to establish an accurate distance of separation between the dice integrating the ASIC electronic circuit 2 and the MEMS detection structure 31, which are separated by a uniform and repeatable thickness of elastic spacing material, and moreover makes it possible to ensure a substantial planarity in the mechanical coupling of the two dice and a stable platform for the wire-bonding operations.

In particular, the first advantage is obtained, at least in part, thanks to the integration of the confinement and spacing structure 10 in the first die 20 of the ASIC electronic circuit, using photolithograhic techniques at the end of the front-end process, while the second advantage is obtained, at least in part, by means of an appropriate pattern of the same confinement and spacing structure 10.

In this regard, the use of lithographic techniques for providing in an integrated manner the confinement and spacing structure 10 moreover enables convenient selection and design of the most appropriate pattern for optimization of the elastic separation between the dice.

Several tests made by the present Applicant have shown that the confinement and spacing structure 10 described previously does not alter significantly the results and electrical performance of the MEMS detection structure 31 and of the associated ASIC electronic circuit 2 as compared to desired design values, even in the presence of mechanical stresses.

The solution described moreover enables improvement of the strength of the mechanical coupling between the dice, at the same time reducing the times and complexity associated to the assembly process.

Finally, it is clear that modifications and variations may be made to what is described and illustrated herein, without thereby departing from the scope of the present disclosure.

In particular, it is clear that the solution described may be applied in the assembly of all integrated semiconductor devices in which stacking is required of at least two dice, integrating respective electronic circuits and/or microelectromechanical structures, with an elastic separation between the same dice.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process comprising:
forming a confinement and spacing structure on a first surface of a first body of semiconductor material, the confinement and spacing structure including a confinement element;
placing an elastic spacer material on at least a portion of the confinement and spacing structure;
stacking a second body of semiconductor material over the first body and the elastic spacer material, the stacking causing the elastic spacer material to flow between the first body and the second body while the confinement element confines the flow of the elastic spacer material.

2. The process according to claim 1, wherein forming the confinement and spacing structure comprises forming and patterning a resist layer on the first surface of the first body.

3. The process according to claim 2, wherein the resist layer includes a dry film laminated on the first surface of the first body.

4. The process according to claim 1, wherein the first body includes at least one integrated electronic circuit and the second body includes at least one microelectromechanical structure.

5. The process according to claim 1, wherein the confinement element has a closed perimeter.

6. The process according to claim 5, wherein the confinement and spacing structure includes at least one first spacer element located within the closed perimeter of the confinement element and is configured to at least in part support the second body.

7. The process according to claim 6, wherein the spacer element is one of a plurality of spacer elements located within the closed perimeter.

8. The process according to claim 6, wherein placing the elastic spacer material on at least a portion of the confinement and spacing structure includes placing the elastic spacer material on spacer element, the process further comprising:
placing the second body on the spacer element so as to distribute uniformly, due to pressure applied, the elastic spacer material within the confinement element; and
curing the elastic spacer material.

9. The process according to claim 1, wherein causing the elastic spacer material to flow comprises applying pressure to a surface of the second body.

10. The process according to claim 9, wherein the second body has a second surface that carries second electrical-contact pads, the process further comprising connecting the first electrical-contact pads to the second electrical-contact pads by electrical wires; the confinement and spacing structure being configured to provide a substantial planarity of a second surface of the second body with respect to the first surface of the first body.

11. The process according to claim 1, wherein the first body includes first electrical-contact pads on the first surface, and wherein forming the confinement and spacing structure comprises forming the confinement and spacing structure at a pre-set distance from the first electrical-contact pads.

12. The process according to claim 1, wherein the elastic spacer material causes the second body to adhere to the first body.

13. A method comprising:
forming a spacing element and a confinement element on a first surface of a first body of semiconductor material, the confinement element having a closed perimeter and the spacing element being located in the closed perimeter of the confinement element;
placing an elastic spacer material on the spacing element;
placing a second body of semiconductor material over the spacing element and the elastic spacer material, the placing causing the elastic spacer material to flow between the first body and the second body, the elastic spacer material being confined in the closed perimeter by the confinement element.

14. The method according to claim 13, wherein spacing element is one of a plurality of spacing elements each located in the closed perimeter.

15. The method according to claim 13, wherein placing the elastic spacer material on the spacing element comprises dispensing elastic spacer material around side and top surfaces of the spacing element.

16. The method according to claim 13, wherein causing the elastic spacer material to flow comprises applying pressure to the second body to cause the elastic spacer material to flow.

17. The method according to claim 13 wherein the elastic spacer material causes the second body to adhere to the first body.

18. An assembly of an integrated device, the assembly comprising:
a first body of semiconductor material and having a top surface;
a confinement element located on the top surface of the first body;
a spacing element located on the top surface of the first body and within the confinement element;
a second body of semiconductor material having a bottom surface, the second body being stacked on the first body and the bottom surface of the second body being over the spacing element; and
an elastic spacer material being confined within the confinement element and surrounding the spacer element.

19. The assembly according to claim 18, comprising at least one integrated electric circuit formed in the first body and at least one microelectromechanical structure formed in the second body.

20. The assembly according to claim 19, wherein the microelectromechanical structure is a pressure-detection structure configured to produce a detection signal based on a pressure, and wherein the integrated electronic circuit is an ASIC configured to receive and process the detection signal.

21. The assembly according to claim 18, wherein the confinement element has a closed perimeter that is configured to confine the elastic spacer material.

22. The assembly according to claim 18, wherein the elastic spacer material causes the second body to adhere to the first body.

23. The assembly according to claim 18, wherein upper surfaces of the confinement element, spacing element, and the elastic spacer material are substantially coplanar.

24. The assembly according to claim 18, wherein the spacing element is one of a plurality of spacing elements located in the confinement element.

25. The assembly according to claim 18, wherein the elastic spacer material has a Young's modulus between approximately 0.5 MPa and 10 MPa.

26. The assembly according to claim 18, wherein the confinement element and the spacing element include photoresist.

27. The assembly according to claim 18, wherein the confinement element and the spacing element touches the top surface of the first body.

* * * * *